(12) United States Patent
Kato et al.

(10) Patent No.: US 9,966,386 B2
(45) Date of Patent: May 8, 2018

(54) SEMICONDUCTOR MEMORY DEVICE AND METHOD FOR MANUFACTURING THE SAME

(71) Applicant: Toshiba Memory Corporation, Minato-ku (JP)

(72) Inventors: Hisashi Kato, Yokkaichi (JP); Hideki Inokuma, Yokkaichi (JP); Naoki Yamamoto, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/455,725

(22) Filed: Mar. 10, 2017

(65) Prior Publication Data

US 2018/0090510 A1    Mar. 29, 2018

(30) Foreign Application Priority Data

Sep. 23, 2016 (JP) .................................. 2016-185112

(51) Int. Cl.
*H01L 27/11* (2006.01)
*H01L 27/11582* (2017.01)
(Continued)

(52) U.S. Cl.
CPC .. *H01L 27/11582* (2013.01); *H01L 21/28273* (2013.01); *H01L 21/28282* (2013.01); *H01L 21/31144* (2013.01); *H01L 27/11519* (2013.01); *H01L 27/11521* (2013.01); *H01L 27/11526* (2013.01); *H01L 27/11556* (2013.01);
(Continued)

(58) Field of Classification Search
CPC ......... H01L 27/11582; H01L 21/28273; H01L 27/11565; H01L 27/11519; H01L 27/11573; H01L 21/28282; H01L 27/11526; H01L 27/11521;
(Continued)

(56) References Cited

U.S. PATENT DOCUMENTS 9,455,268 B2 * 9/2016 Oh ..................... H01L 27/11575
9,831,270 B2 * 11/2017 Sudo ................. H01L 27/11582
(Continued)

FOREIGN PATENT DOCUMENTS

JP     2013-4690     1/2013
JP     2014-27104    2/2014

*Primary Examiner* — William Coleman
(74) *Attorney, Agent, or Firm* — Oblon, McClelland, Maier & Neustadt, L.L.P.

(57) ABSTRACT

According to one embodiment, a semiconductor memory device includes first to third conductive layers extending along a first direction, and a memory portion. A portion of the second conductive layer is provided between the third conductive layer and a portion of the first conductive layer. The first conductive layer includes a first end portion crossing the first direction. The second conductive layer includes a second end portion crossing the first direction. The third conductive layer includes a third end portion crossing the first direction. A position in the first direction of a portion of the second end portion is between a position of the first end portion and a position of the third end portion. The position in the first direction of the portion of the second end portion is between a position of another portion of the second end portion and the position of the third end portion.

6 Claims, 10 Drawing Sheets

(51) Int. Cl.
    *H01L 21/311*     (2006.01)
    *H01L 27/11556*     (2017.01)
    *H01L 27/11521*     (2017.01)
    *H01L 27/11526*     (2017.01)
    *H01L 27/11568*     (2017.01)
    *H01L 27/11573*     (2017.01)
    *H01L 27/11519*     (2017.01)
    *H01L 27/11565*     (2017.01)
    *H01L 21/28*     (2006.01)

(52) U.S. Cl.
    CPC .. *H01L 27/11565* (2013.01); *H01L 27/11568* (2013.01); *H01L 27/11573* (2013.01)

(58) Field of Classification Search
    CPC ......... H01L 27/11556; H01L 21/31144; H01L 27/11568
    See application file for complete search history.

(56) References Cited

U.S. PATENT DOCUMENTS

| | | | |
|---|---|---|---|
| 2009/0310415 A1* | 12/2009 | Jin | H01L 27/11519 365/185.17 |
| 2009/0310425 A1* | 12/2009 | Sim | H01L 27/11526 365/185.29 |
| 2012/0306089 A1 | 12/2012 | Freeman et al. | |
| 2012/0319173 A1 | 12/2012 | Ko et al. | |
| 2014/0015057 A1 | 1/2014 | Lee et al. | |
| 2014/0027838 A1 | 1/2014 | Kido et al. | |
| 2014/0203442 A1* | 7/2014 | Yun | G11C 5/063 257/773 |
| 2017/0179025 A1* | 6/2017 | Yun | H01L 23/5283 |
| 2017/0200676 A1* | 7/2017 | Jeong | H01L 23/5283 |

* cited by examiner

SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2016-185112, filed on Sep. 23, 2016; the entire contents of which are incorporated herein by reference.

FIELD

Embodiments described herein relate generally to a semiconductor device and a method for manufacturing the same.

BACKGROUND

It is desirable to reduce the device surface area of a semiconductor memory device.

BRIEF DESCRIPTION OF THE DRAWINGS

FIG. 7A and FIG. 7B are schematic plan views illustrating the semiconductor memory device according to the first embodiment;

DETAILED DESCRIPTION

Figure 1A:
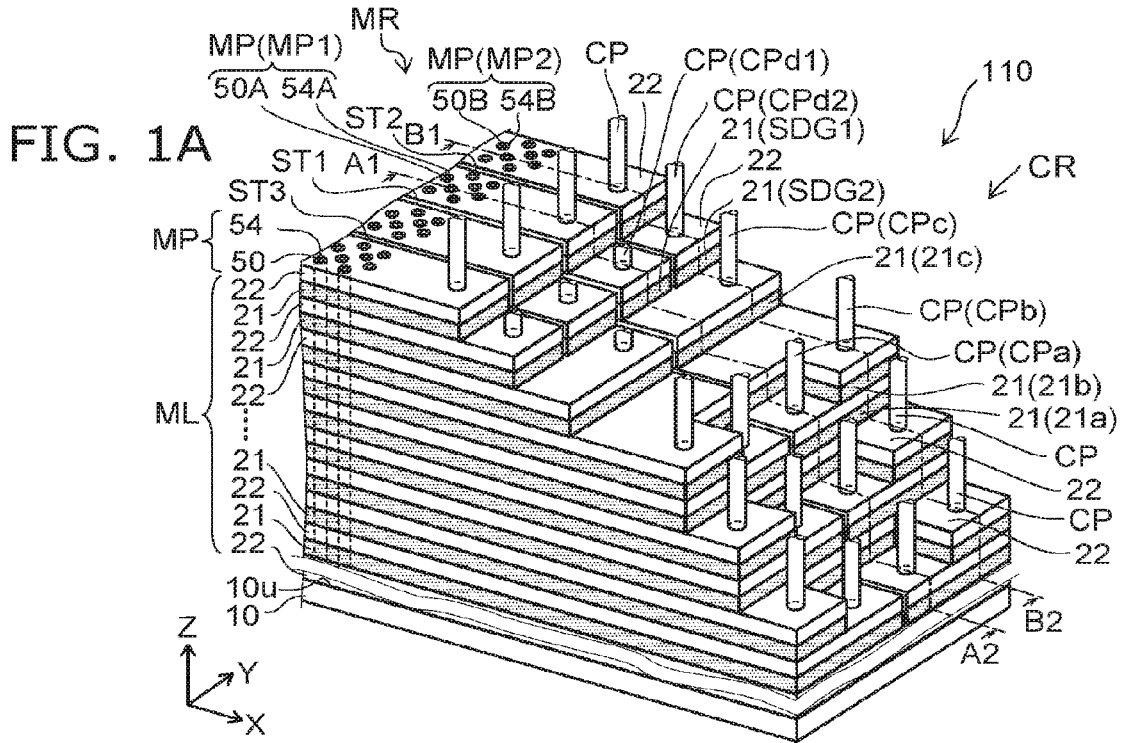
FIG. 1A to FIG. 1C are schematic views illustrating a semiconductor memory device according to a first embodiment.

According to one embodiment, a semiconductor memory device includes first to third conductive layers extending along a first direction, and a memory portion. A portion of the second conductive layer is provided between the third conductive layer and a portion of the first conductive layer in a second direction crossing the first direction. The first conductive layer includes a first end portion having a first end portion side surface crossing the first direction. The second conductive layer includes a second end portion having a second end portion side surface crossing the first direction. The third conductive layer includes a third end portion having a third end portion side surface crossing the first direction. A position in the first direction of a portion of the second end portion is between a position in the first direction of the first end portion and a position in the first direction of the third end portion. The position in the first direction of the portion of the second end portion is between a position in the first direction of another portion of the second end portion and the position in the first direction of the third end portion.

According to one embodiment, a semiconductor memory device includes a first conductive layer extending along a first direction, a second conductive layer extending along the first direction and being separated from the first conductive layer in a second direction crossing the first direction, and a memory portion. The second conductive layer includes first to third partial regions. The second partial region is disposed between the memory portion and the first partial region. The third partial region is disposed between the first partial region and the second partial region. A first length of the first partial region along a third direction is longer than a third length of the third partial region along the third direction. The third direction crosses the first direction and the second direction. A second length of the second partial region along the third direction is longer than the third length.

According to one embodiment, a semiconductor memory device includes a first conductive layer extending along a first direction, a second conductive layer extending along the first direction and being separated from the first conductive layer in a second direction crossing the first direction, a third conductive layer extending along the first direction, being separated from the second conductive layer in a third direction, and being separated from the first conductive layer in the second direction, the third direction crossing the first direction and the second direction, a fourth conductive layer extending along the first direction, a portion of the second conductive layer being disposed between the fourth conductive layer and the first conductive layer in the second direction, and a memory portion crossing at least one of the first conductive layer, the second conductive layer, or the fourth conductive layer in the first direction. The first conductive layer includes a first end portion having a first end portion side surface crossing the first direction. The second conductive layer includes a second end portion having a second end portion side surface crossing the first direction. The third conductive layer includes a third end portion having a third end portion side surface crossing the first direction. The fourth conductive layer includes a fourth end portion having a fourth end portion side surface crossing the first direction. A position in the first direction of the second end portion is between a position in the first direction of the first end portion and a position in the first direction of the fourth end portion. The position in the first direction of the second end portion is between a position in the first direction of the third end portion and the position in the first direction of the fourth end portion.

According to one embodiment, a method for manufacturing a semiconductor memory device is disclosed. The method can include forming a trench in a stacked structure body. The stacked structure body includes a plurality of first films and a plurality of second films provided alternately in a stacking direction. The trench extends in a first direction crossing the stacking direction. The trench pierces one of the plurality of first films and one of the plurality of second films in the stacking direction. The one of the plurality of first films is in contact with the one of the plurality of second films in the stacking direction. The method can include forming a mask material on the stacked structure body where the trench is formed. In addition, the method can include repeating a removing of a portion of the stacked structure body and a recessing of a first-direction end of the mask material, the removing being performed by using the mask material as a mask.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figure 1B:
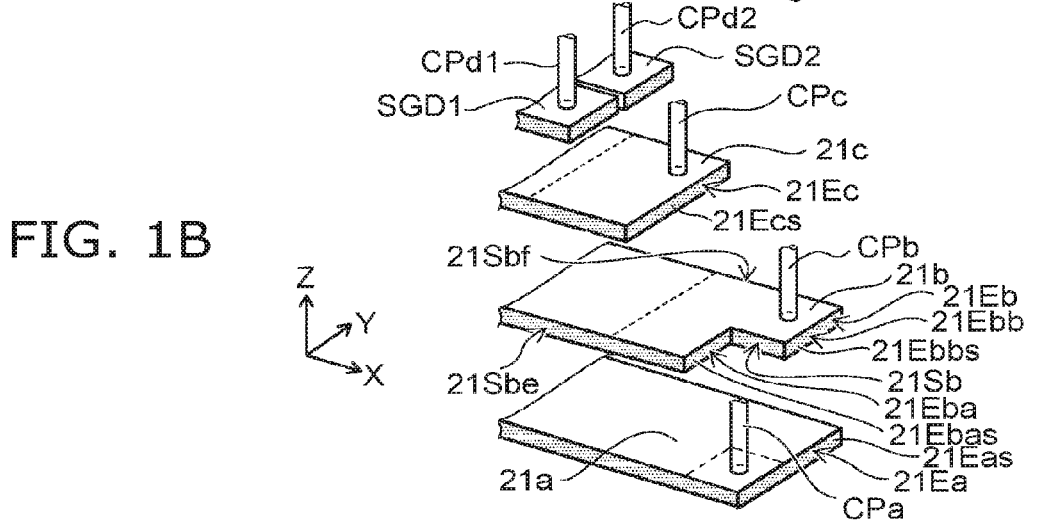
Figure 1C:
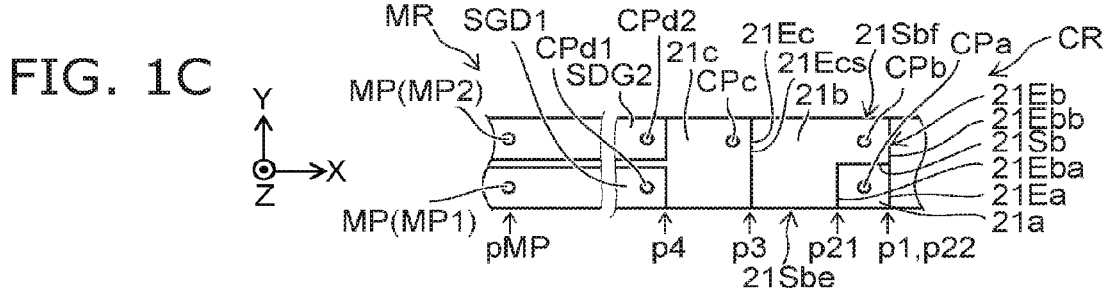

FIG. 1A to FIG. 1C are schematic views illustrating a semiconductor memory device according to a first embodiment.

FIG. 1A and FIG. 1B are perspective views. A portion shown in FIG. 1A is extracted and illustrated in FIG. 1B. FIG. 1C is a plan view.

As shown in FIG. 1A and FIG. 1B, the semiconductor memory device 110 according to the embodiment includes multiple conductive layers 21 (first to third conductive layers 21a to 21c, etc.) and memory portions MP (e.g., a first memory portion MP1, a second memory portion MP2, etc.). As shown in FIG. 1A, an insulating layer 22 is provided in each region between the multiple conductive layers 21. The number of the multiple conductive layers 21 is arbitrary. In FIG. 1B, the conductive layers 21 (a first drain-side selection gate SGD1 and a second drain-side selection gate SGD2) that are described below are drawn in addition to the first to third conductive layers 21a to 21c. In FIG. 1B and FIG. 1C, the insulating layers 22 are not illustrated for easier viewing of the drawing.

As shown in FIG. 1B, the multiple conductive layers 21 (the first to third conductive layers 21a to 21c, etc.) extend along a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

One direction crossing the first direction is taken as a second direction. For example, the second direction is the Z-axis direction. In the second direction, a portion of a second conductive layer 21b is provided between the third conductive layer 21c and a portion of the first conductive layer 21a. For example, the second conductive layer 21b is provided on a portion of the first conductive layer 21a; and the third conductive layer 21c is provided on a portion of the second conductive layer 21b.

As shown in FIG. 1A, the memory portions MP (the first memory portion MP1, the second memory portion MP2, etc.) cross the first to third conductive layers 21a to 21c. For example, the memory portions MP extend along the second direction (the Z-axis direction). An example of the memory portions MP is described below. The region where the memory portions MP are provided corresponds to a memory region MR of the semiconductor memory device 110.

The multiple conductive layers 21 are connected to the memory portions MP; and connecting bodies CP are provided at the multiple conductive layers 21. Each of the multiple conductive layers 21 is connected to an interconnect (not illustrated in these drawings) via the connecting body CP. The region where the connecting bodies CP are provided corresponds to a connection region CR of the semiconductor memory device 110.

As shown in FIG. 1B, the first to third conductive layers 21a to 21c respectively include first to third end portions 21Ea to 21Ec. Each of these end portions has a side surface crossing the X-axis direction. These end portions include ends in the X-axis direction of the conductive layers 21. For example, the first end portion 21Ea has a first end portion side surface 21Eas crossing the first direction (the X-axis direction). The second end portion 21Eb has a second end portion side surface (a side surface 21Ebas and a side surface 21Ebbs) crossing the first direction. The third end portion 21Ec has a third end portion side surface 21Ecs crossing the first direction.

As shown in FIG. 1B, in the semiconductor memory device 110, the second end portion 21Eb of the second conductive layer 21b includes two portions. In other words, the second conductive layer 21b includes two regions having mutually-different lengths in the X-axis direction.

A position p21 in the X-axis direction of a portion 21Eba of the second end portion 21Eb is different from a position p22 in the X-axis direction of another portion 21Ebb of the second end portion 21Eb (referring to FIG. 1C). Compared to the other portion 21Ebb of the second end portion 21Eb, the portion 21Eba of the second end portion 21Eb is recessed along the X-axis direction. The region that includes the other portion 21Ebb of the second end portion 21Eb is arranged in the Y-axis direction with the region including the portion 21Eba of the second end portion 21Eb.

For example, the position p21 in the first direction (the X-axis direction) of the portion 21Eba of the second end portion 21Eb is between a position p1 in the first direction (the X-axis direction) of the first end portion 21Ea and a position p3 in the first direction (the X-axis direction) of the third end portion 21Ec.

The position p21 in the first direction (the X-axis direction) of the portion 21Eba of the second end portion 21Eb is between the position p22 in the first direction (the X-axis direction) of the other portion 21Ebb of the second end portion 21Eb and the position p3 in the first direction (the X-axis direction) of the third end portion 21Ec.

For example, the portion 21Eba of the second end portion 21Eb is recessed along the X-axis direction with the first end portion 21Ea of the first conductive layer 21a as a reference. On the other hand, for example, the other portion 21Ebb of the second end portion 21Eb may be at the same position as the first end portion 21Ea of the first conductive layer 21a. In other words, the other portion 21Ebb of the second end portion 21Eb protrudes along the X-axis direction with the portion 21Eba of the second end portion 21Eb as a reference.

As shown in FIG. 1B, for example, a second connecting body CPb (e.g., a contact plug) can be provided at the protruding portion of the second conductive layer 21b. On the other hand, a first connecting body CPa (e.g., a contact plug) is provided in the region of the first conductive layer 21a not overlapping the second conductive layer 21b.

Thus, a region where it is possible to provide the first connecting body CPa is provided in the first conductive layer 21a. A region where it is possible to provide the second connecting body CPb is provided in the second conductive layer 21b. As shown in FIG. 1C, at least a portion of the region where it is possible to provide the first connecting body CPa may overlap the region where it is possible to provide the second connecting body CPb in the Y-axis direction. Therefore, the length along the X-axis direction of the region where it is possible to provide the connecting bodies CP can be set to be short.

For example, there is a reference example in which the multiple conductive layers 21 having a staircase configuration are provided. In the reference example, the position in the X-axis direction of the end portion is constant for each of the multiple conductive layers 21. In other words, two regions are not provided in the second end portion 21Eb of the second conductive layer 21b. In other words, the other portion 21Ebb recited above is not provided; and only the portion 21Eba recited above is provided. Thus, in the reference example, the end portions of the multiple conductive layers 21 have a simple staircase configuration; and the connecting bodies CP that are provided at the multiple conductive layers 21 are arranged in a straight line configuration along the X-axis direction. In such a reference example, the region where the connecting bodies CP are provided is long compared to that of the embodiment recited above (the portion 21Eba and the other portion 21Ebb provided in the second end portion 21Eb recited above).

Conversely, in the embodiment, two regions that have mutually-different lengths in the X-axis direction are provided in a portion of the multiple conductive layers 21 (e.g., the second conductive layer 21b). The two regions that have mutually-different lengths in the X-axis direction can be utilized as the positions where the contact plugs are provided. Therefore, the first connecting body CPa can be arranged with the second connecting body CPb along a direction (e.g., the Y-axis direction) crossing the X-axis direction (referring to FIG. 1B and FIG. 1C). Then, a set of two connecting bodies CP arranged in the Y-axis direction can be arranged in the X-axis direction according to the end portions of the staircase configuration (referring to FIG. 1A).

In the embodiment, the length in the X-axis direction of the region where it is possible to provide the connecting bodies CP can be set to be smaller than that of the reference example recited above. Accordingly, the size (e.g., the length in the X-axis direction) of the connection region CR can be smaller than that of the reference example recited above. According to the embodiment, a semiconductor memory device can be provided in which a reduction of the device surface area is possible.

As shown in FIG. 1C, the position p21 in the first direction (the X-axis direction) of the portion 21Eba of the second end portion 21Eb recited above is between the position p1 in the first direction of the first end portion 21Ea and a position pMP in the first direction of the memory portion MP. The position p3 in the first direction of the third end portion 21Ec is between the position p21 in the first direction of the portion 21Eba of the second end portion 21Eb recited above and the position pMP in the first direction of the memory portion MP.

As shown in FIG. 1B, the first connecting body CPa extends along the second direction (the Z-axis direction) and is electrically connected to the first conductive layer 21a. As shown in FIG. 1C, the position in the first direction (the X-axis direction) of the first connecting body CPa is between the position p21 in the first direction (the X-axis direction) of the portion 21Eba of the second end portion 21Eb recited above and the position p1 in the first direction (the X-axis direction) of the first end portion 21Ea.

On the other hand, as shown in FIG. 1B, the second connecting body CPb extends along the second direction (the Z-axis direction) and is electrically connected to the second conductive layer 21b. As shown in FIG. 1C, the position in the first direction (the X-axis direction) of the second connecting body CPb is between the position p21 in the first direction (the X-axis direction) of the portion 21Eba of the second end portion 21Eb recited above and the position p1 in the first direction (the X-axis direction) of the first end portion 21Ea.

For example, at least a portion of the second connecting body CPb may overlap the first connecting body CPa in a third direction (a direction crossing the first direction and the second direction) (referring to FIG. 1C). In the example, the third direction is the Y-axis direction. Thereby, the length in the X-axis direction of the region where these connecting bodies CP are provided can be reduced.

As shown in FIG. 1B and FIG. 1C, a portion of the end portion of the first conductive layer 21a may be aligned with a portion of the end portion of the second conductive layer 21b. For example, at least a portion of the other portion 21Ebb of the second end portion 21Eb of the second conductive layer 21b recited above may overlap at least a portion of the first end portion 21Ea of the first conductive layer 21a in the second direction (the Z-axis direction).

As described above, the two regions that have mutually-different lengths in the X-axis direction are provided in the second conductive layer 21b. These two regions may be discriminated by a middle side surface 21Sb provided in a portion of the second conductive layer 21b (referring to FIG. 1B). The middle side surface 21Sb of the second conductive layer 21b is provided between the portion 21Eba of the second end portion 21Eb recited above and the other portion 21Ebb of the second end portion 21Eb recited above. The middle side surface 21Sb links the portion 21Eba and the other portion 21Ebb. The middle side surface 21Sb is aligned with the first direction (the X-axis direction).

The widths (the widths along the Y-axis direction) of the two regions provided in the second conductive layer 21b recited above are, for example, substantially the same. For example, two side-portion side surfaces (a first side-portion side surface 21Sbe and a second side-portion side surface 21Sbf) are provided in the second conductive layer 21b. These side-portion side surfaces are aligned with the X-axis direction. The length in the Y-axis direction between the first side-portion side surface 21Sbe and the second side-portion side surface 21Sbf corresponds to the width of the second conductive layer 21b. For example, the distance (the length in the Y-axis direction) between the first side-portion side surface 21Sbe and the middle side surface 21Sb is, for example, not less than 0.8 times and not more than 1.2 times the distance (the length in the Y-axis direction) between the second side-portion side surface 21Sbf and the middle side surface 21Sb. Thereby, for example, the width in the Y-axis direction of the region where it is possible to provide the second connecting body CPb can be substantially the same as the width in the Y-axis direction of the region where it is possible to provide the first connecting body CPa. For example, the tolerable width of the patterning precision can be enlarged. For example, the widths in the Y-axis direction of these regions can be set to be small.

As shown in FIG. 1A, for example, a stacked body ML that includes the multiple conductive layers 21 and the multiple insulating layers 22 is provided on a base body 10. The base body 10 may include, for example, at least a portion of a semiconductor substrate (e.g., a silicon substrate). The base body 10 may be provided on the semiconductor substrate. An upper surface 10u of the base body 10 is substantially perpendicular to the Z-axis direction.

For example, one or more of the multiple conductive layers 21 proximal to the base body 10 is used as a source-side selection gate described below. Some of the multiple conductive layers 21 provided on the source-side selection gate function as word lines of the semiconductor memory device 110. For example, one or more conductive layers 21 that are provided on the multiple conductive layers 21 functioning as the word lines function as a drain-side selection gate.

Two such stacked bodies ML are provided in the example shown in FIG. 1A. For example, each of the two stacked bodies ML corresponds to a "block." A first slit ST1 is provided between the two blocks. The first slit ST1 divides the multiple conductive layers 21 included in each of the two stacked bodies ML. The staircase configurations of the two stacked bodies ML have, for example, mirror symmetry with the first slit ST1 as the axis of symmetry.

The multiple drain-side selection gates (the first drain-side selection gate SGD1, the second drain-side selection gate SGD2, etc.) are provided in one stacked body ML (block). A slit (a second slit ST2 or a third slit ST3) is provided between the multiple drain-side selection gates. These slits divide one drain-side selection gate but do not divide the multiple conductive layers 21 functioning as the word lines.

In the example, each of the multiple drain-side selection gates includes the multiple conductive layers 21. For example, the effective thickness of the conductive layers (the total thickness of the multiple conductive layers) functioning as the multiple drain-side selection gates is thicker than the thickness of one conductive layer 21 functioning as the word line. Thereby, for example, the cut-off characteristics of the semiconductor layer included in the memory portion MP can be good. As described below, in the case where the multiple conductive layers 21 are formed by a "replacement method," a wide patterning margin is obtained because the thicknesses of the multiple conductive layers 21 functioning as the selection gates are substantially the same as that of one conductive layer 21 functioning as the word line; and the multiple conductive layers 21 can be formed with high productivity.

The multiple drain-side selection gates (the first drain-side selection gate SGD1 and the second drain-side selection gate SGD2) have a staircase configuration and are recessed in the X-axis direction from the conductive layers 21 functioning as the word lines.

As shown in FIG. 1C, for example, a position p4 in the X-axis direction of the end portions of the multiple drain-side selection gates (the first drain-side selection gate SGD1 and the second drain-side selection gate SGD2) is between the position pMP in the X-axis direction of the memory portion MP and the position p3 in the X-axis direction of the third conductive layer 21c functioning as the word line.

As shown in FIG. 1A to FIG. 1C, a third connecting body CPc that extends in the Z-axis direction and is electrically connected to the third conductive layer 21c is provided. A connecting body CPd1 that extends in the Z-axis direction and is connected to the first drain-side selection gate SGD1 is further provided. A connecting body CPd2 that extends in the Z-axis direction and is connected to the second drain-side selection gate SGD2 is provided.

The multiple conductive layers 21 include, for example, a metal such as tungsten, etc. The insulating layers 22 include, for example, silicon oxide, etc. The connecting bodies CP include, for example, at least one of copper or aluminum. These materials are examples; and the materials of the conductive layers 21, the insulating layers 22, and the connecting bodies CP in the embodiment are arbitrary.

On the other hand, in the example as shown in FIG. 1A, each of the multiple memory portions MP extends along the second direction (the Z-axis direction) through the multiple conductive layers 21. One memory portion MP includes a semiconductor body 50 and a memory film 54. The semiconductor body 50 extends in the Z-axis direction through the stacked body ML. In other words, the semiconductor body extends in the Z-axis direction through the multiple conductive layers 21. The semiconductor body 50 includes, for example, silicon, etc.

The multiple memory portions MP include, for example, the first memory portion MP1, the second memory portion MP2, etc. For example, the first memory portion MP1 extends in the Z-axis direction through the multiple conductive layers 21 including the first drain-side selection gate SGD1. For example, the second memory portion MP2 extends in the Z-axis direction through the multiple conductive layers 21 including the second drain-side selection gate SGD2. Multiple first memory portions MP1 and multiple second memory portions MP2 are provided.

For example, the first memory portion MP1 includes a first semiconductor body 50A and a first memory film 54A. The second memory portion MP2 includes a second semiconductor body 50B and a second memory film 54B.

An example of the memory portions MP will now be described.

FIG. 2A to FIG. 2D are schematic cross-sectional views illustrating the semiconductor memory device according to the first embodiment.

Figure 2A:
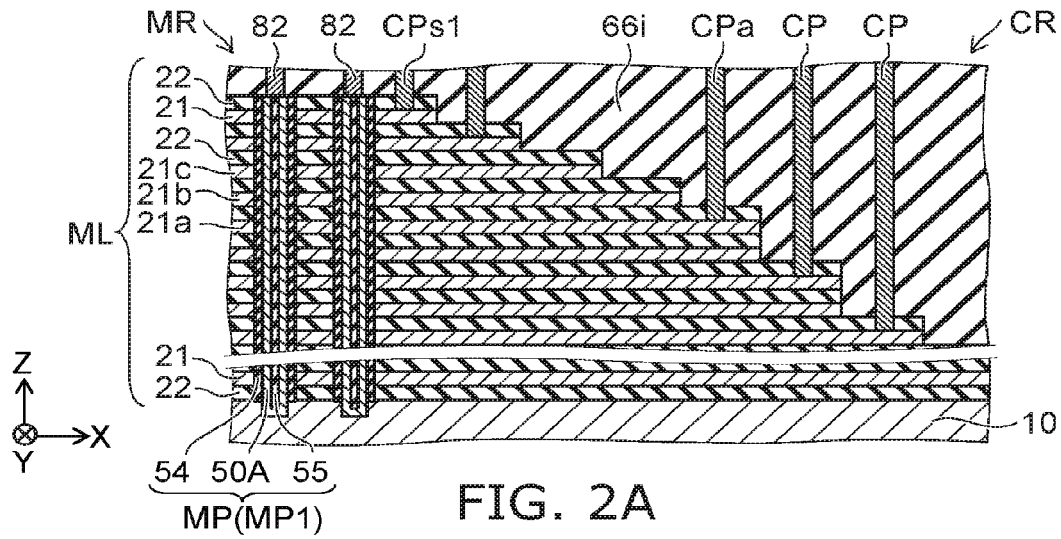
FIG. 2A to FIG. 2D are schematic cross-sectional views illustrating the semiconductor memory device according to the first embodiment.
Figure 2B:
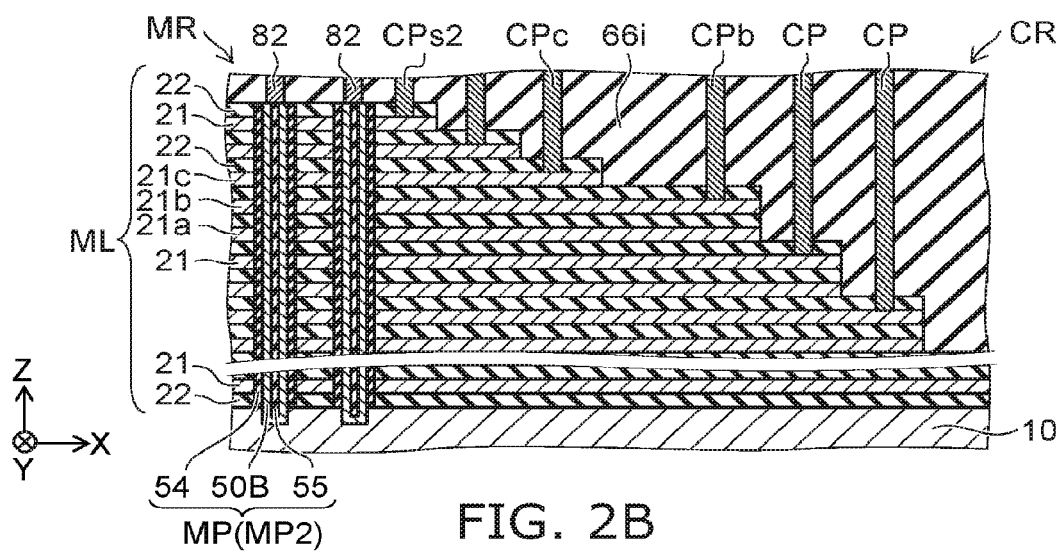
Figures 2C, 2D:
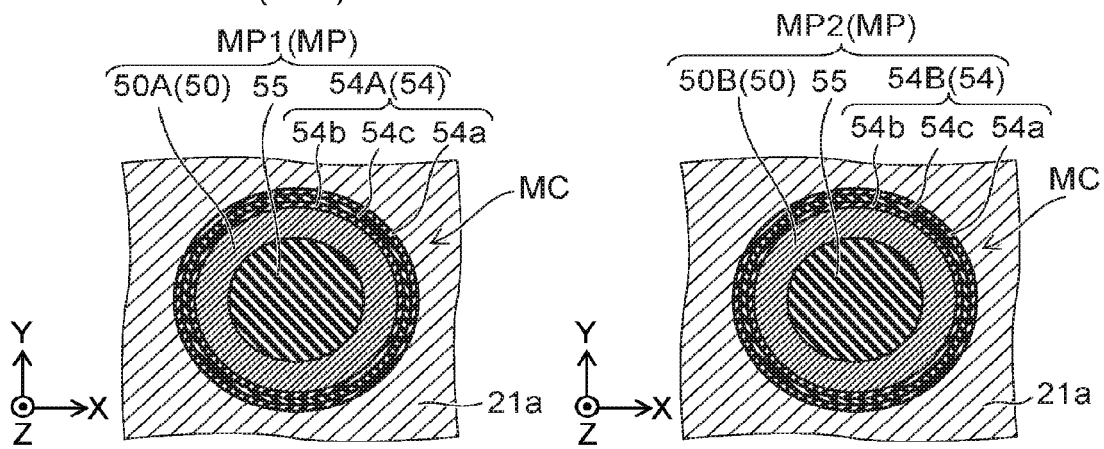

FIG. 2A is a line A1-A2 cross-sectional view of FIG. 1A. FIG. 2B is a line B1-B2 cross-sectional view of FIG. 1A. FIG. 2C illustrates the first memory portion MP1. FIG. 2D illustrates the second memory portion MP2.

As shown in FIG. 2A, the first semiconductor body 50A of the first memory portion MP1 extends in the second direction (the Z-axis direction) through the multiple conductive layers 21. The first memory film 54A of the first memory portion MP1 is provided between the first semiconductor body 50A and the multiple conductive layers 21. In the example, the first semiconductor body 50A has a pipe-like configuration. A core 55 (e.g., an insulating member) is provided inside the first semiconductor body 50A having the pipe-like configuration. For example, the first semiconductor body 50A is electrically connected to a not-illustrated bit line by a connecting body 82.

As shown in FIG. 2C, the first memory film 54A includes a first memory insulating film 54a, a second memory insulating film 54b, and a memory intermediate portion 54c. The first memory insulating film 54a is provided between the first semiconductor body 50A and the multiple conductive layers 21 (in the drawing, the first conductive layer 21a). The second memory insulating film 54b is provided between the first memory insulating film 54a and the first semiconductor body 50A. The memory intermediate portion 54c is provided between the first memory insulating film 54a and the second memory insulating film 54b. For example, the first memory insulating film 54a functions as a blocking insulating film. For example, the second memory insulating film 54b functions as a tunneling insulating film. These insulating films include, for example, silicon oxide, etc. These insulating films may include aluminum oxide, etc. For example, the memory intermediate portion 54c functions as a charge storage layer. In such a case, the memory intermediate portion 54c includes silicon nitride, etc. For example, the memory intermediate portion 54c may function as a floating gate. In such a case, the memory intermediate portion 54c includes polysilicon, etc.

In the second memory portion MP2 as shown in FIG. 2B, the second semiconductor body 50B extends in the Z-axis direction through the multiple conductive layers 21. The second memory film 54B of the second memory portion MP2 is provided between the second semiconductor body 50B and the multiple conductive layers 21. As shown in FIG. 2D, for example, the configuration of the second memory portion MP2 is similar to the configuration of the first memory portion MP1; and a description is therefore omitted.

As shown in FIG. 2A and FIG. 2B, an insulating portion 66i is provided in the recess formed at the end portions of the multiple conductive layers 21 having the staircase configuration.

Memory cells MC (memory transistors) are formed at the portions where the semiconductor body 50 and the multiple conductive layers 21 functioning as the word lines cross (referring to FIG. 2C and FIG. 2D). Charge is stored in the memory intermediate portion 54c in each of the multiple memory cells MC. The threshold voltage of the memory cell MC changes according to the amount of the stored charge. The multiple semiconductor bodies 50 each are selected by the operations of the drain-side selection gate and the source-side selection gate. The charge is injected into or extracted from the memory intermediate portion 54c according to the potential difference between the semiconductor body 50 and the conductive layer 21 used as the word line. Thereby, programming and erasing of information is performed. Then, the information is read by sensing the threshold voltage of the memory cell MC. The information that is stored may be multi-bit.

In the semiconductor memory device 110, the multiple memory cells MC that are arranged in the Z-axis direction form one memory string. Multiple memory strings are arranged in the X-Y plane. Thereby, the multiple memory cells MC are arranged three-dimensionally.

An example of a method for manufacturing the semiconductor memory device 110 will now be described.

Figure 3A:
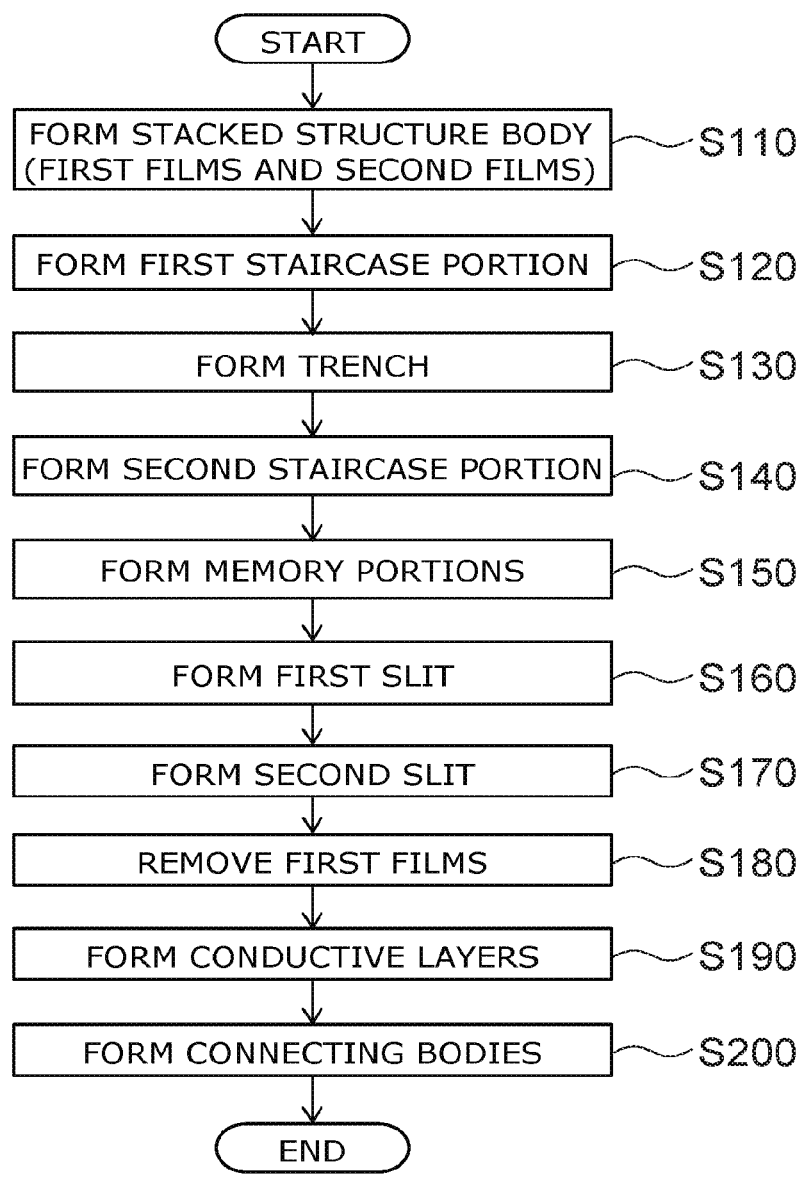
FIG. 3A and FIG. 3B are flowcharts illustrating a method for manufacturing the semiconductor memory device according to the first embodiment.
Figure 3B:
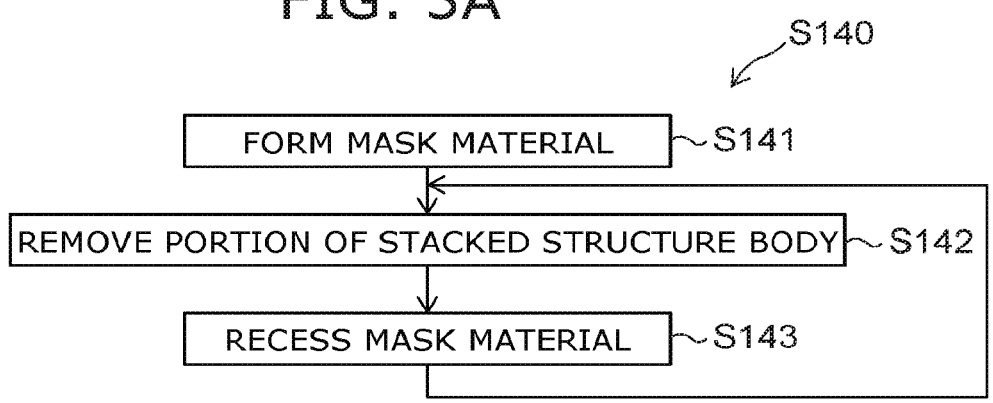

FIG. 3A and FIG. 3B are flowcharts illustrating the method for manufacturing the semiconductor memory device according to the first embodiment.

FIG. 3B illustrates a portion of the processes shown in FIG. 3A.

Figure 4A:
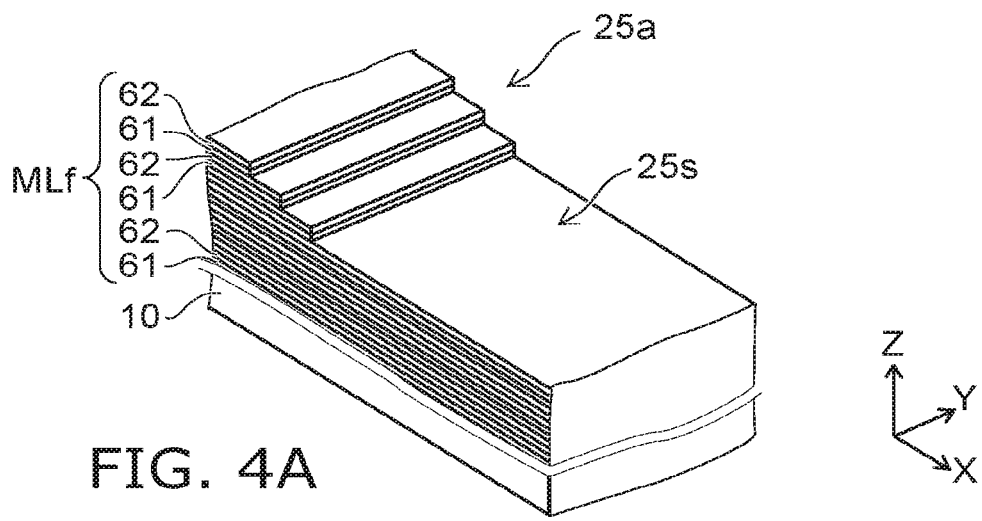
FIG. 4A to FIG. 4C are schematic perspective views illustrating the method for manufacturing the semiconductor memory device according to the first embodiment.
Figure 4B:
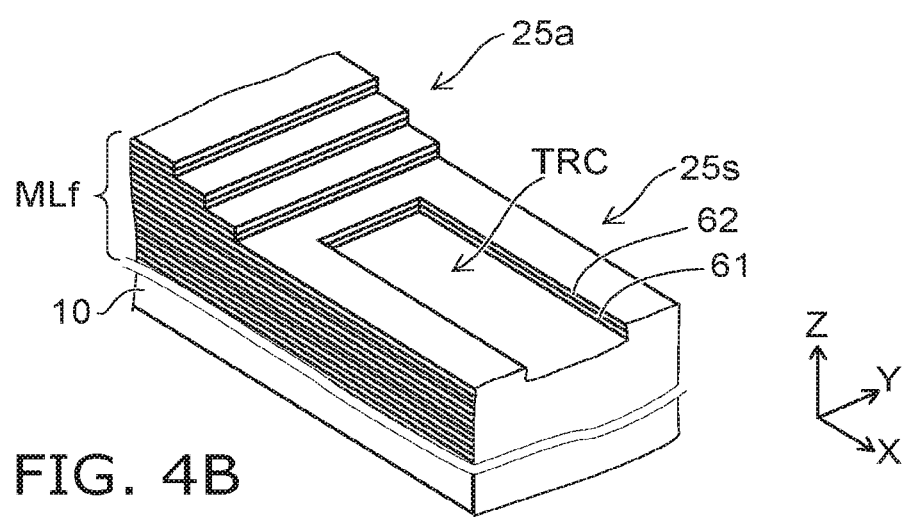
Figure 4C:
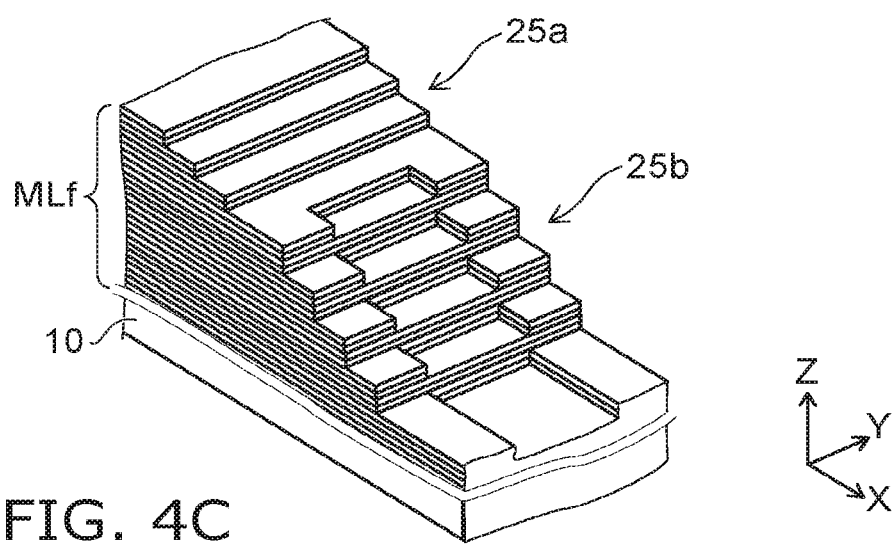

FIG. 4A to FIG. 4C are schematic perspective views illustrating the method for manufacturing the semiconductor memory device according to the first embodiment.

As shown in FIG. 3A, a stacked structure body is formed on the base body 10 (step S110); further, a first staircase portion is formed (step S120).

As shown in FIG. 4A, the stacked structure body MLf includes multiple first films 61 and multiple second films 62 provided alternately. The first films 61 include, for example, silicon nitride. The second films 62 include, for example, silicon oxide. The first films 61 are, for example, sacrificial layers. The second films 62 are, for example, the insulating layers 22. In other words, as described below, the stacked body ML is formed from the stacked structure body MLf.

As shown in FIG. 4A, the first staircase portion 25a is provided in such a stacked structure body MLf. The first staircase portion 25a is provided in the upper portion of the stacked structure body MLf (the portion distal to the base body 10). A terrace portion 25s is formed in the lower portion where the first staircase portion 25a is not provided.

The first staircase portion 25a includes multiple steps along the X-axis direction. For example, a mask material (not illustrated) is provided at a portion on the stacked structure body MLf; and a removing (etching) of a portion of the stacked structure body MLf using the mask material and a slimming of the mask material are repeated. Thereby, the first staircase portion 25a is formed.

A trench is formed as shown in FIG. 3A (step S130).

As shown in FIG. 4B, the trench TRC that is formed in the stacked structure body MLf is provided in the terrace portion 25s of the stacked structure body MLf. The trench TRC extends in the first direction (the X-axis direction) crossing the stacking direction (the Z-axis direction). The trench TRC pierces one of the multiple first films 61 and one of the multiple second films 62 in the stacking direction. The one of the multiple first films 61 is in contact with the one of the multiple second films 62 recited above in the stacking direction.

As shown in FIG. 3A, a second staircase portion 25b is formed in the stacked structure body MLf (step S140).

As shown in FIG. 4C, the second staircase portion 25b has a staircase configuration in the X-axis direction and the Y-axis direction.

Subsequently, the memory portions MP are formed as shown in FIG. 3A (step S150). For example, the memory portions MP are formed by forming memory holes that pierce the stacked structure body MLf in the Z-axis direction, and by filling the memory film 54 and the semiconductor body 50 into the memory holes.

Subsequently, the first slit ST1 (referring to FIG. 1A) is formed (step S160). The first slit ST1 divides the stacked structure body MLf used to form the stacked body ML in the Y-axis direction.

Subsequently, the second slit ST2 (and the third slit ST3) (referring to FIG. 1A) are formed (step S170). These slits divide, in the Y-axis direction, the first films 61 included in the upper portion of the stacked structure body MLf.

Subsequently, the first films 61 are removed (step S180). For example, the multiple first films 61 are etched via the slits recited above. In the case where the first films 61 include silicon nitride, for example, a phosphoric acid solution or the like is used as the etchant.

Subsequently, a conductive material is introduced to the spaces formed by removing the first films 61. Thereby, the multiple conductive layers 21 are formed (step S190). The second films 62 are used to form the insulating layers 22. Thereby, the stacked body ML is formed. Subsequently, the insulating portion 66i is formed.

Subsequently, the multiple connecting bodies CP are formed (step S200). The multiple connecting bodies CP are electrically connected respectively to the multiple conductive layers 21. Subsequently, the interconnects, etc., are formed; and the semiconductor memory device 110 is made.

An example of the formation of the trench recited above (step S130) and the formation of the second staircase portion 25b (step S140) will now be described.

FIG. 5A to FIG. 5D and FIG. 6A to FIG. 6C are schematic perspective views illustrating the method for manufacturing the semiconductor memory device according to the first embodiment.

Figure 5A:
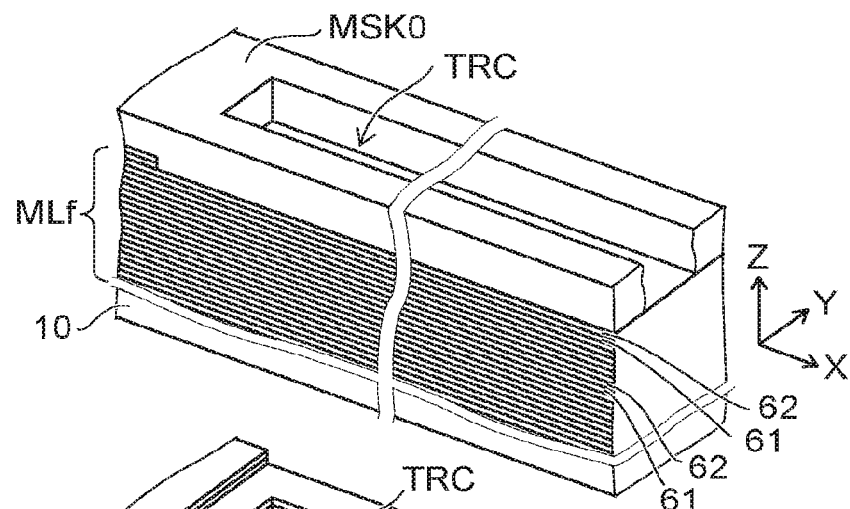
FIG. 5A to FIG. 5D and FIG. 6A to FIG. 6C are schematic perspective views illustrating the method for manufacturing the semiconductor memory device according to the first embodiment.
Figure 5B:
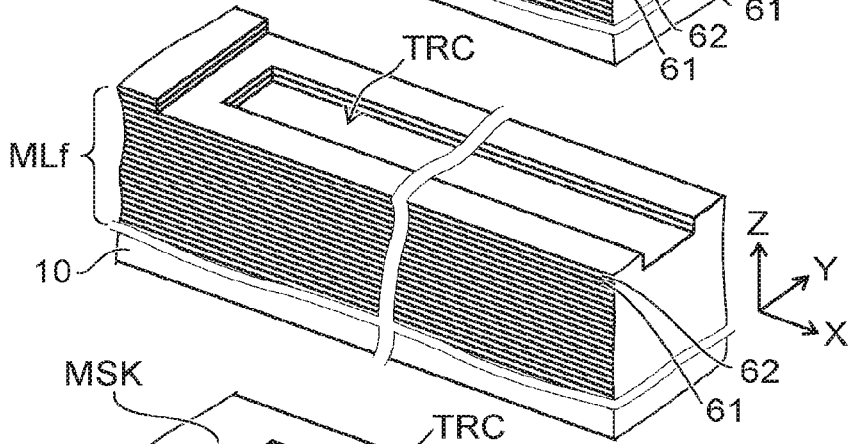

FIG. 5A and FIG. 5B correspond to the formation of the trench recited above (step S130). FIG. 5C, FIG. 5D, FIG. 6A to FIG. 6C, and FIG. 3B correspond to the formation of the second staircase portion 25b (step S140).

As shown in FIG. 5A, a trench formation mask MSK0 is formed on the stacked structure body MLf where the trench TRC is formed. The opening of the trench formation mask MSK0 extends along the X-axis direction. The stacked structure body MLf is etched using the trench formation mask MSK0 as a mask.

Thereby, as shown in FIG. 5B, a portion of the first films 61 and a portion of the second films 62 included in the upper portion of the stacked structure body MLf are removed. Thereby, the trench TRC that extends along the X-axis direction is formed in the stacked structure body MLf.

Figure 5C:
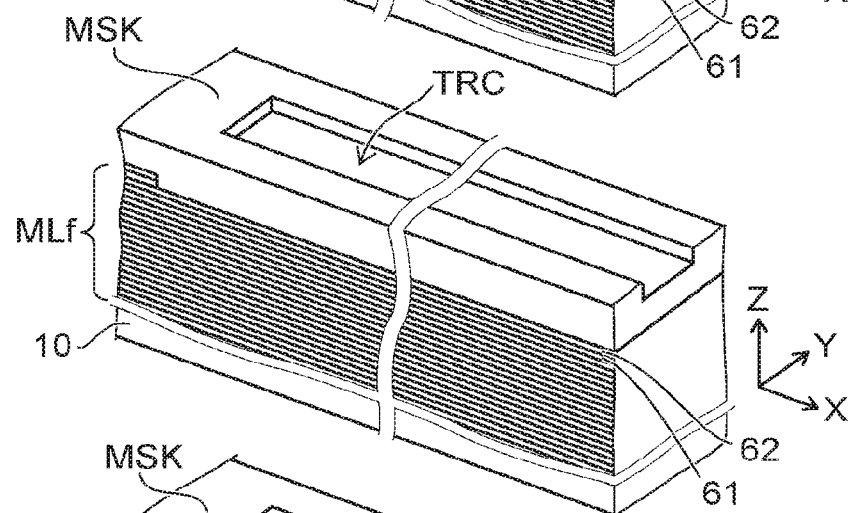

As shown in FIG. 3B and FIG. 5C, a mask material MSK is formed on the stacked structure body MLf where the trench TRC is formed (step S141).

As shown in FIG. 3B, a removing (step S142) of a portion of the stacked structure body MLf is performed using the mask material MSK as a mask. A recessing (step S143) of the end in the first direction (the X-axis direction) of the mask material MSK is performed. Then, such a step S142 and step S143 are repeated alternately.

Figure 5D:
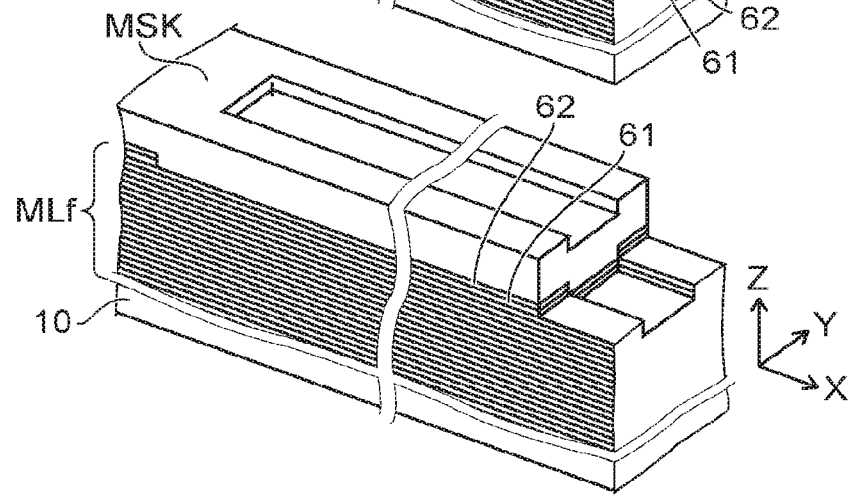

For example, as shown in FIG. 5D, the end in the first direction (the X-axis direction) of the mask material MSK is recessed. In other words, the mask material MSK is slimmed. Then, a removing (etching) of a portion of the stacked structure body MLf is performed using the mask material MSK having the recessed end as a mask.

Figure 6A:
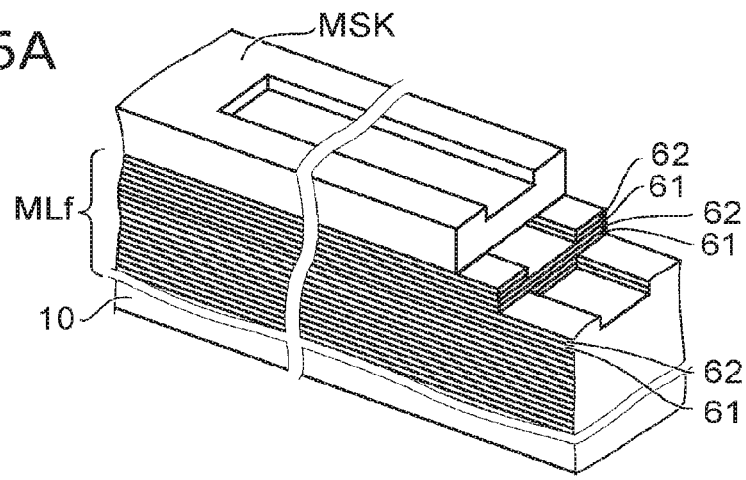
Figure 6B:
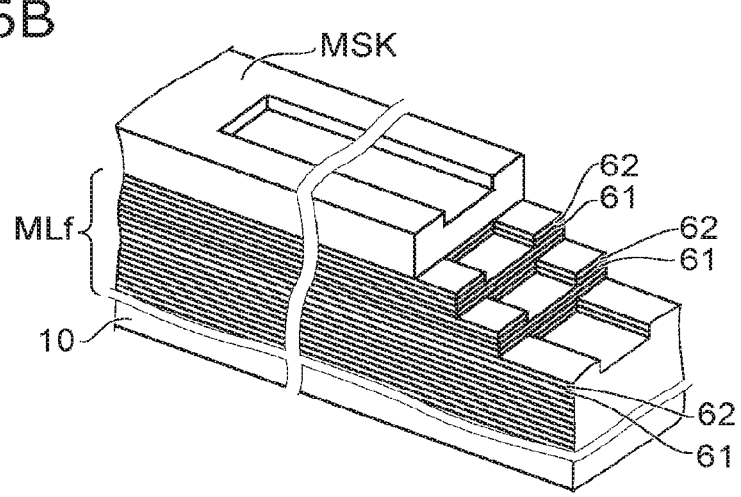
Figure 6C:
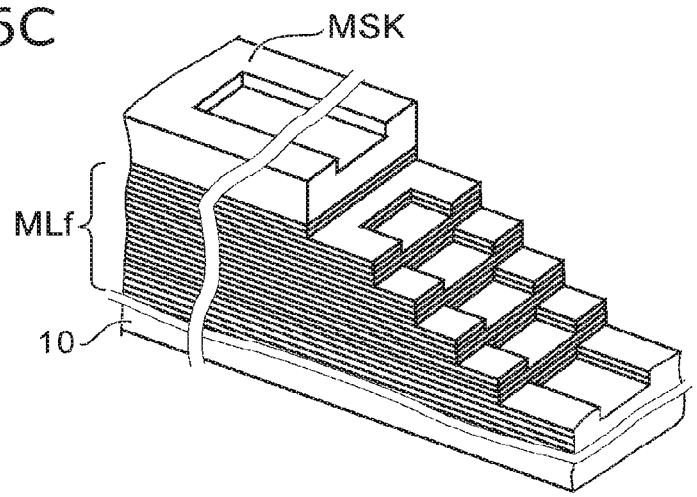

As shown in FIG. 6A to FIG. 6C, these steps are repeated. Thereby, the second staircase portion 25b is formed in the stacked structure body MLf.

The stacked body ML is formed from the stacked structure body MLf thus formed; and the semiconductor memory device 110 is formed.

Figures 7A, 7B:
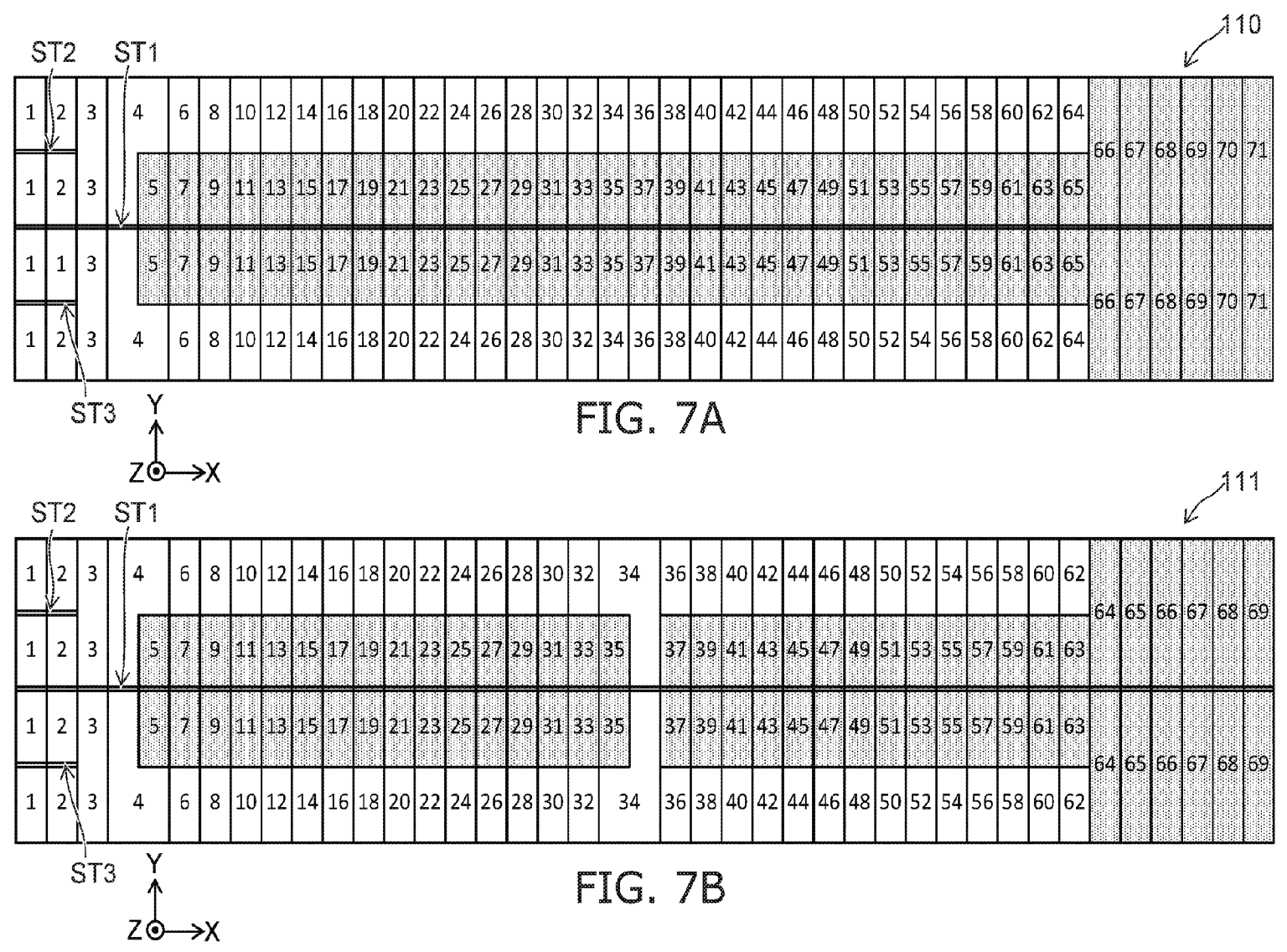

FIG. 7A and FIG. 7B are schematic plan views illustrating the semiconductor memory device according to the first embodiment.

FIG. 7A illustrates the staircase portions (the first staircase portion 25a and the second staircase portion 25b) of the semiconductor memory device 110. The staircase portions are provided in the stacked body ML or the stacked structure body MLf.

The numerals in FIG. 7A show the positions along the Z-axis direction of each of the multiple conductive layers 21. "1" shows the conductive layer 21 (the "first" conductive layer 21) most distal to the base body 10 in the Z-axis direction. The "first" conductive layer 21 is the uppermost conductive layer 21. "i" (i being an integer not less than 1) shows the "ith" conductive layer 21 using the uppermost conductive layer 21 as the reference. A larger "i" is more proximal to the base body 10.

The region in FIG. 7A where the "dot pattern" is provided corresponds to the trench TRC (FIG. 4B) and corresponds to the lower side of the staircase in the Y-axis direction of the second staircase portion 25b.

In FIG. 7A, first regions (multiple regions arranged in the X-axis direction) that are marked with the numerals 4, 6, 8, . . . , 64 have a staircase configuration dropping two levels each level difference. Second regions (multiple regions arranged in the X-axis direction) that are marked with numerals 5, 7, 9, . . . , 65 also have a staircase configuration dropping two levels each level difference. Also, the first region and the second region are arranged in the Y-axis direction. These first regions and second regions are arranged in the Y-axis direction. These regions have a staircase configuration dropping one level each level difference along the Y-axis direction.

FIG. 7B illustrates another semiconductor memory device 111 according to the embodiment.

In the semiconductor memory device 111 illustrated in FIG. 7B as well, the first regions (the multiple regions arranged in the X-axis direction) that are marked with the numerals 4, 6, 8, . . . , 32 have a staircase configuration dropping two levels each level difference. The second regions (the multiple regions arranged in the X-axis direction) that are marked with the numerals 5, 7, 9, . . . , 33 also have a staircase configuration dropping two levels each level difference. Then, in such a case as well, the first region and the second region are arranged in the Y-axis direction; and a staircase that drops one level each level difference along the Y-axis direction is formed. In the semiconductor memory device 111, the region marked with "34" is on the right side of the region marked with "35." In other words, in the X-axis direction, the 34th conductive layer (higher than the 35th) appears after the 35th conductive layer 21.

In the semiconductor memory device 111 as well, two regions of the conductive layers 21 where the connecting bodies CP can be formed can be arranged in the Y-axis direction. A semiconductor memory device in which a reduction of the device surface area is possible can be provided.

In the manufacturing of the semiconductor memory device, if the number of repetitions is excessively high when repeatedly performing the combination of the slimming and the etching recited above, there are cases where the error of the pattern formation becomes large and it is difficult to obtain the desired configuration. In such a case, another repeating that uses another mask material MSK may be implemented after repeatedly performing the combination of the slimming and the etching. Thereby, the stacked structure body MLf that has a high number of stacks can be patterned with high precision. For example, when applying such a method, the configuration of the semiconductor memory device 111 recited above is obtained.

For example, when the number of stacks of the stacked body ML increases, there are cases where the margin in the exposure in the patterning process is insufficient. For example, there are also cases where the precision of the conversion difference in the patterning process is insufficient. In such a case, for example, a sufficient margin is obtained by subdividing the pattern of the formation of the staircase portion along the Y-axis direction. For example, it becomes easy to reduce the length of the staircase portion (the length in the X-axis direction).

An example of such a semiconductor memory device 111 will now be described. In the following description, a description is omitted for at least some of the portions similar to those of the semiconductor memory device 110.

Figure 8A:
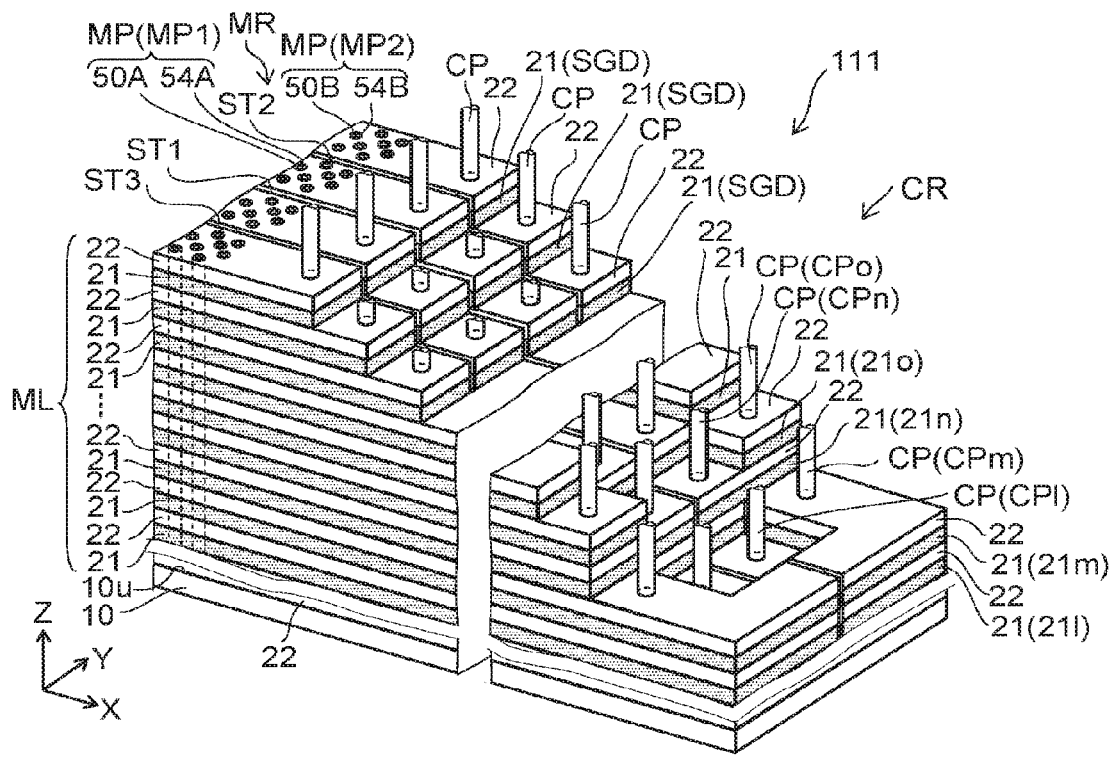
FIG. 8A to FIG. 8C are schematic views illustrating another semiconductor memory device according to the first embodiment.
Figure 8B:
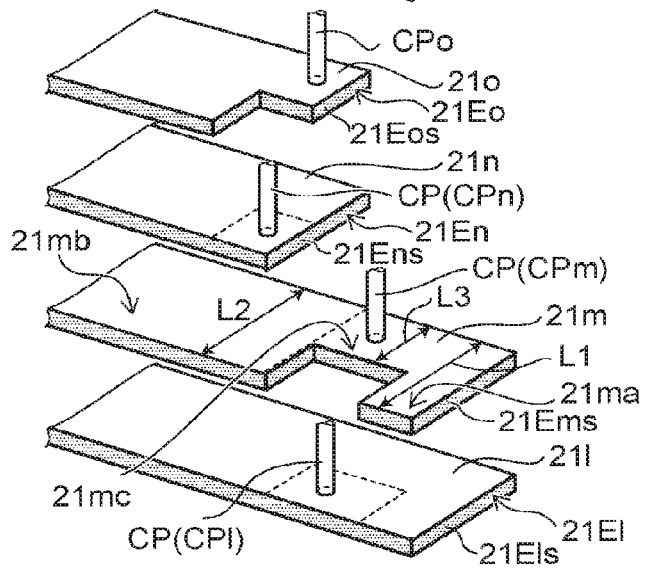
Figure 8C:
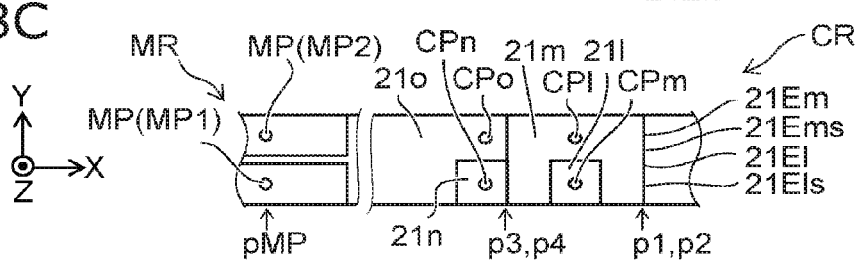

FIG. 8A to FIG. 8C are schematic views illustrating another semiconductor memory device according to the first embodiment.

FIG. 8A and FIG. 8B are perspective views. A portion shown in FIG. 8A is extracted and illustrated in FIG. 8B. FIG. 8C is a plan view.

As shown in FIG. 8A and FIG. 8B, the semiconductor memory device 111 according to the embodiment includes a first conductive layer 21l, a second conductive layer 21m, and the memory portion MP. A third conductive layer 21n and a fourth conductive layer 21o may be further provided. For example, the first to fourth conductive layers 21i to 21o function as word lines. First to fourth connecting bodies CPl to CPo are further provided. The first to fourth connecting bodies CPl to CPo are electrically connected respectively to the first to fourth conductive layers 21l to 21o.

These conductive layers (the first to third conductive layers 21l to 21n) extend along the first direction (the X-axis direction). The second conductive layer 21m is separated from the first conductive layer 21l in the second direction (the Z-axis direction) crossing the first direction.

In the example as shown in FIG. 8B, a recess is provided along the Y-axis direction in the second conductive layer 21m. For example, the second conductive layer 21m includes first to third partial regions 21ma to 21mc. The second partial region 21mb is disposed between the memory portion MP and the first partial region 21ma. The third partial region 21mc is disposed between the first partial region 21ma and the second partial region 21mb.

As shown in FIG. 8B, a first length L1 of the first partial region 21*ma* along the third direction (the Y-axis direction) crossing the first direction and the second direction is longer than a third length L3 of the third partial region 21*mc* along the third direction (the Y-axis direction). A second length L2 of the second partial region 21*mb* along the third direction (the Y-axis direction) is longer than the third length L3.

Thus, the third partial region 21*mc* that has a narrow width is provided in the second conductive layer 21*m*. Such a third partial region 21*mc* is provided between the two partial regions (the first partial region 21*ma* and the second partial region 21*mb*) having wide widths.

It is possible to provide the second connecting body CPm on the third partial region 21*mc* having the narrow width. On the other hand, the first conductive layer 21*l* includes a region that does not overlap the second conductive layer 21*m* in the Z-axis direction. It is possible to provide the first connecting body CPl in the region not overlapping the second conductive layer 21*m*.

For example, at least two of these connecting bodies CP may overlap each other in the Y-axis direction. In other words, the regions where it is possible to provide these connecting bodies CP overlap in the Y-axis direction. Thereby, for example, the length in the X-axis direction of the region (the connection region CR) for providing the connecting bodies CP can be set to be short. In the semiconductor memory device 111 as well, a semiconductor memory device in which a reduction of the device surface area is possible can be provided.

For example, the first connecting body CPl extends along the second direction (the Z-axis direction) and is electrically connected to the first conductive layer 21*l*. As shown in FIG. 8B and FIG. 8C, the first connecting body CPl overlaps the third partial region 21*mc* of the second conductive layer 21*m* in the Y-axis direction.

For example, at least a portion of the first connecting body CPl is between the first partial region 21*ma* and the second partial region 21*mb* in the first direction (the X-axis direction).

As shown in FIG. 8B and FIG. 8C, the first conductive layer 21*l* includes a first end portion 21El. At least a portion of the first partial region 21*ma* overlaps at least a portion of the first end portion 21El in the second direction (the Z-axis direction). The first end portion 21El has a first end portion side surface 21Els crossing the X-axis direction.

The second partial region 21*mb* of the second conductive layer 21*m* is disposed between the third conductive layer 21*n* and a portion of the first conductive layer 21*l*. The third conductive layer 21*n* does not overlap the first partial region 21*ma* and the third partial region 21*mc* in the second direction (the Z-axis direction).

In the example as well, the second connecting body CPm that is electrically connected to the second conductive layer 21*m* is provided. The second connecting body CPm extends along the second direction (the Z-axis direction).

As shown in FIG. 8C, the position along the first direction (the X-axis direction) of the second connecting body CPm is between the position in the first direction (the X-axis direction) of the first partial region 21*ma* and the position in the first direction (the X-axis direction) of the third conductive layer 21*n*. In the example, the second connecting body CPm overlaps the third partial region 21*mc* in the Z-axis direction.

On the other hand, for example, the second conductive layer 21*m* is disposed between the first conductive layer 21*l* and the fourth conductive layer 21*o*; and the third conductive layer 21*n* is disposed between the second conductive layer 21*m* and the fourth conductive layer 21*o*.

A narrow region is provided in the width (the length in the Y-axis direction) of the fourth conductive layer 21*o*. The third conductive layer 21*n* includes a region not overlapping the fourth conductive layer 21*o*. The third connecting body CPn is provided in this region of the third conductive layer 21*n*. At least a portion of the fourth connecting body CPo electrically connected to the fourth conductive layer 21*o* may be arranged with the third connecting body CPn in the Y-axis direction.

As shown in FIG. 8C, a second end portion 21Em of the second conductive layer 21*m* has a second end portion side surface 21Ems crossing the X-axis direction. A position p2 along the X-axis direction of the second end portion 21Em may be substantially the same as the position p1 along the X-axis direction of the first end portion 21El. For example, at least a portion of the second end portion 21Em may overlap the first end portion 21El in the Z-axis direction.

A third end portion 21En of the third conductive layer 21*n* has a third end portion side surface 21Ens crossing the X-axis direction. A fourth end portion 21Eo of the fourth conductive layer 21*o* has a fourth end portion side surface 21Eos crossing the X-axis direction. The position p4 along the X-axis direction of at least a portion of the fourth end portion 21Eo may be substantially the same as the position p3 along the X-axis direction of the third end portion 21En.

Second Embodiment

In the embodiment, the lengths of two drain-side selection gates arranged in the Y-axis direction are different from each other.

Figure 9A:
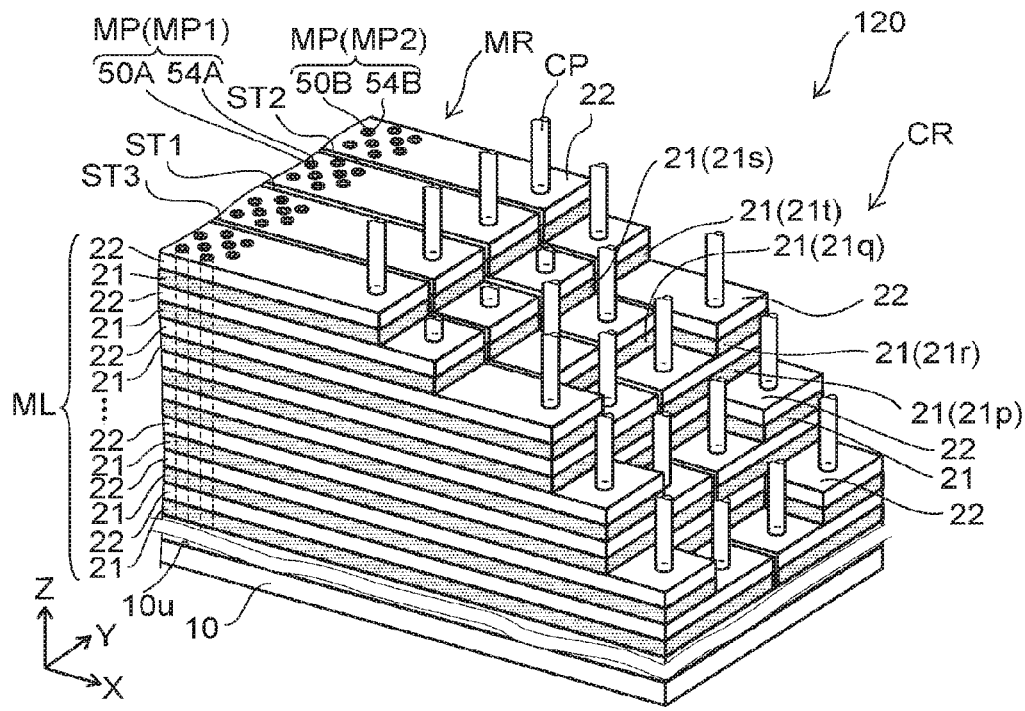
FIG. 9A to FIG. 9C are schematic views illustrating a semiconductor memory device according to the second embodiment.
Figure 9B:
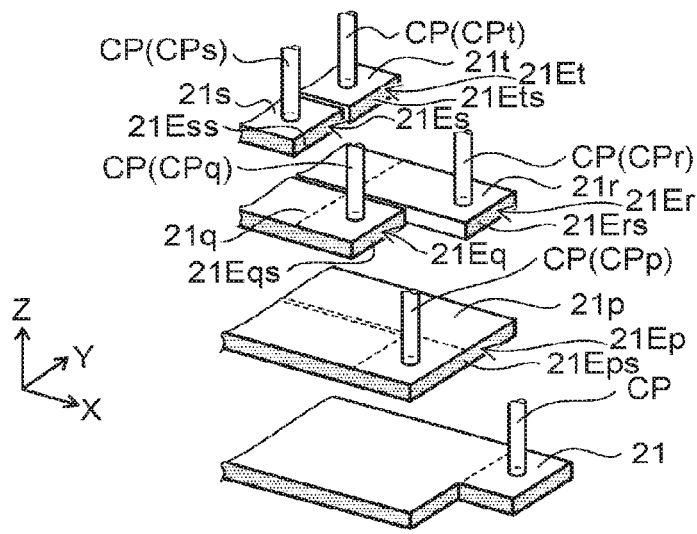
Figure 9C:
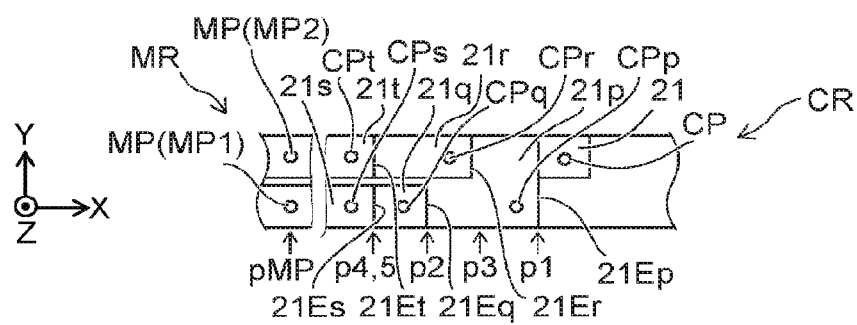

FIG. 9A to FIG. 9C are schematic views illustrating a semiconductor memory device according to the second embodiment.

FIG. 9A and FIG. 9B are perspective views. A portion shown in FIG. 9A is extracted and illustrated in FIG. 9B. FIG. 9C is a plan view.

As shown in FIG. 9A and FIG. 9B, the semiconductor memory device 120 according to the embodiment includes first to fifth conductive layers 21*p* to 21*t* and the memory portions MP (the first memory portion MP1 and the second memory portion MP2). For example, the first conductive layer 21*p* functions as a word line. The second conductive layer 21*q* and the third conductive layer 21*r* function as one set of drain-side selection gates arranged in the Y-axis direction. The fourth conductive layer 21*s* and the fifth conductive layer 21*t* function as one other set of drain-side selection gates arranged in the Y-axis direction. First to fifth connecting bodies CPp to CPt are provided. The first to fifth connecting bodies CPp to CPt are electrically connected respectively to the first to fifth conductive layers 21*p* to 21*t*.

The first to fifth conductive layers 21*p* to 21*t* extend in the first direction (the X-axis direction).

The second conductive layer 21*q* is separated from the first conductive layer 21*p* in the second direction (the Z-axis direction) crossing the first direction. The third conductive layer 21*r* is separated from the second conductive layer 21*q* in the second direction (the Z-axis direction). The third conductive layer 21*r* is separated from the second conductive layer 21*q* in the third direction (the Y-axis direction) crossing the first direction and the second direction.

The fourth conductive layer 21*s* is provided on the second conductive layer 21*q*. In other words, a portion of the second conductive layer 21*q* is disposed between the fourth conductive layer 21*s* and the first conductive layer 21*p* in the second direction (the Z-axis direction).

The fifth conductive layer 21t is arranged with the fourth conductive layer 21s in the third direction (the Y-axis direction). A portion of the third conductive layer 21r is disposed between the fifth conductive layer 21t and the first conductive layer 21p in the second direction (the Z-axis direction).

As shown in FIG. 9A and FIG. 9C, the first memory portion MP1 crosses at least one of the first conductive layer 21p, the second conductive layer 21q, or the fourth conductive layer 21s in the first direction (the X-axis direction).

Another memory portion MP (the second memory portion MP2) crosses at least one of the first conductive layer 21p or the third conductive layer 21r in the first direction (the X-axis direction). The second memory portion MP2 may further cross the fifth conductive layer 21t in the X-axis direction.

The first to fifth conductive layers 21p to 21t respectively include first to fifth end portions 21Ep to 21Et. The first to fifth end portions 21Ep to 21Et respectively have first to fifth end portion side surfaces 21Eps to 21Ets. These end portion side surfaces cross the first direction (the X-axis direction).

As shown in FIG. 9C, the position p2 in the first direction (the X-axis direction) of the second end portion 21Eq is between the position p1 in the first direction of the first end portion 21Ep and the position p4 in the first direction of the fourth end portion 21Es. The position p2 in the first direction of the second end portion 21Eq is between the position p3 in the first direction of the third end portion 21Er and the position p4 in the first direction of the fourth end portion 21Es.

Thus, the first conductive layer 21p, the second conductive layer 21q, and the fourth conductive layer 21s have a staircase configuration. For the second conductive layer 21q and the third conductive layer 21r that are arranged with each other in the Y-axis direction, the length of the second conductive layer 21q is shorter than the length of the third conductive layer 21r. In other words, the end of the second conductive layer 21q is recessed with the end of the third conductive layer 21r as the reference. The first conductive layer 21p includes a region not overlapping the second conductive layer 21q in the Z-axis direction.

For example, the first connecting body CPp that is connected to the first conductive layer 21p can be provided in the region where the second conductive layer 21q is recessed. For example, at least a portion of the third connecting body CPr connected to the third conductive layer 21r may overlap the first connecting body CPp in the Y-axis direction.

Thus, in the semiconductor memory device 120 as well, the region of the first conductive layer 21p where the first connecting body CPp can be provided can be arranged in the Y-axis direction with the region of the third conductive layer 21r where the third connecting body CPr can be provided. For example, the length in the X-axis direction of the connection region CR can be set to be short. For example, a semiconductor memory device in which a reduction of the device surface area is possible can be provided.

As shown in FIG. 9C, the position p2 in the first direction of the second end portion 21Eq is between the position p1 in the first direction of the first end portion 21Ep and a position p5 in the first direction of the fifth end portion 21Et. The position p2 in the first direction of the second end portion 21Eq is between the position p3 in the first direction of the third end portion 21Er and the position p5 in the first direction of the fifth end portion 21Et.

The position p2 in the first direction of the second end portion 21Eq is between the position p3 in the first direction of the third end portion 21Er and the position pMP in the first direction of the first memory portion MP1.

Figure 10:
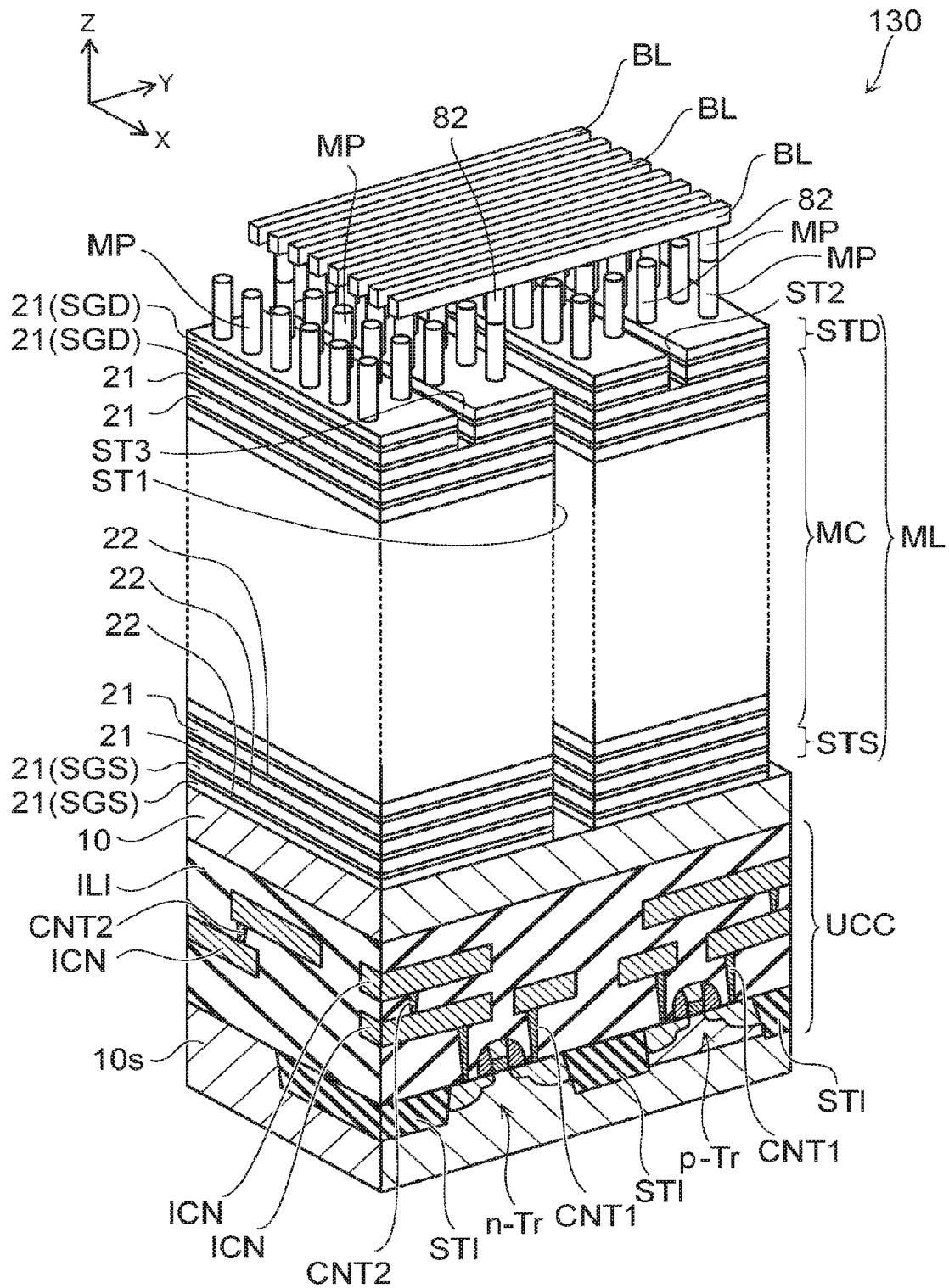
FIG. 10 is a schematic perspective view illustrating a semiconductor memory device according to the embodiment.

FIG. 10 is a schematic perspective view illustrating a semiconductor memory device according to the embodiment.

In the semiconductor memory device 130 as shown in FIG. 10, the base body 10 is provided at the upper portion of a silicon substrate 10s; and the stacked body ML is provided on the base body 10. The base body 10 may be, for example, a semiconductor layer. A source-side selection transistor STS is provided at the lower portion of the stacked body ML; and a drain-side selection transistor STD is provided at the upper portion of the stacked body ML. A portion of the multiple conductive layers 21 is used as a source-side selection gate SGS. Multiple pillar-shaped structure bodies (the memory portions MP) extend through the stacked body ML. The memory portions MP include the memory films 54 and the semiconductor bodies 50. The semiconductor bodies 50 are electrically connected to the bit lines BL. In the drawing, a slit (the first slit ST1) is provided between the two stacked bodies ML. A conductive portion (not illustrated) may be provided in the first slit ST1. The base body 10 is connected to a source line (not illustrated) via the conductive portion.

In the silicon substrate 10s, the base body 10 (e.g., the semiconductor layer) is provided on an inter-layer insulating film ILI. The inter-layer insulating film ILI includes, for example, silicon oxide. An under-cell circuit UCC (e.g., a peripheral circuit) is provided in the silicon substrate 10s. The under-cell circuit UCC includes a drive circuit. For example, the drive circuit performs the programming, reading, and erasing of data to and from the transistors of the memory cells MC. The under-cell circuit UCC includes, for example, sense amplifiers.

For example, the silicon substrate 10s is subdivided into multiple active areas by insulating portions STI (Shallow Trench Isolation). An n-type transistor n-Tr (MOSFET (Metal-Oxide-Semiconductor Field-Effect Transistor)) is provided in one active area. A p-type transistor p-Tr (MOSFET) is provided in one other active area. Multiple interconnects ICN are provided in multiple layers inside the inter-layer insulating film ILI. Connection members CNT1 that connect the multiple interconnects ICN to the silicon substrate 10s are further provided. Connection members CNT2 that connect the multiple interconnects ICN to each other are further provided.

In the semiconductor memory device 130, the surface area of the semiconductor memory device 130 can be small because the under-cell circuit UCC (e.g., the peripheral circuit) is provided at the portion under the memory cells MC. In the semiconductor memory device 130, any of the embodiments recited above or a modification of the embodiments is applicable to the configuration of the memory region MR.

According to the embodiments, a semiconductor memory device in which a reduction of the device surface area is possible and a method for manufacturing the semiconductor memory device are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as conductive layers, insulating layers, memory portions, connecting bodies, base bodies, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices, and methods for manufacturing semiconductor memory devices practicable by an appropriate design modification by one skilled in the art based on the semiconductor memory devices, and the methods for manufacturing semiconductor memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
    a first conductive layer extending along a first direction;
    a second conductive layer extending along the first direction and being separated from the first conductive layer in a second direction crossing the first direction; and
    a memory portion,
    the second conductive layer including first to third partial regions,
    the second partial region being disposed between the memory portion and the first partial region,
    the third partial region being disposed between the first partial region and the second partial region,
    a first length of the first partial region along a third direction being longer than a third length of the third partial region along the third direction, the third direction crossing the first direction and the second direction,
    a second length of the second partial region along the third direction being longer than the third length, wherein
    the semiconductor memory device further comprises first connecting body extending along the second direction and being electrically connected to the first conductive layer, the first connecting body overlapping the third partial region in the third direction.

2. The device according to claim 1, wherein at least a portion of the first connecting body is between the first partial region and the second partial region in the first direction.

3. The device according to claim 1, wherein
    the first conductive layer includes a first end portion, and
    at least a portion of the first partial region overlaps at least a portion of the first end portion in the second direction.

4. The device according to claim 1, further comprising a third conductive layer extending along the first direction,
    the second partial region being disposed between the third conductive layer and a portion of the first conductive layer,
    the third conductive layer not overlapping the first partial region and the third partial region in the second direction.

5. The device according to claim 1, further comprising a second connecting body extending along the second direction and being electrically-connected to the second conductive layer,
    the second connecting body overlapping the third partial region in the second direction.

6. The device according to claim 4, further comprising a second connecting body extending along the second direction and being electrically connected to the second conductive layer,
    a position along the first direction of the second connecting body being between a position in the first direction of the first partial region and a position in the first direction of the third conductive layer.

* * * * *